(12) United States Patent
Chu et al.

(10) Patent No.: US 10,157,907 B2
(45) Date of Patent: Dec. 18, 2018

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Yu-Lin Chu, Hsinchu (TW); Hsi-Yu Kuo, Hsinchu (TW); Chin-Yuan Ko, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 473 days.

(21) Appl. No.: 14/958,056

(22) Filed: Dec. 3, 2015

(65) Prior Publication Data
US 2017/0162558 A1 Jun. 8, 2017

(51) Int. Cl.
| | | |
|---|---|---|
| *H01L 27/02* | (2006.01) | |
| *H01L 23/522* | (2006.01) | |
| *H01L 23/528* | (2006.01) | |
| *H01L 27/092* | (2006.01) | |
| *H01L 29/10* | (2006.01) | |
| *H01L 29/78* | (2006.01) | |

(52) U.S. Cl.
CPC ........ *H01L 27/0292* (2013.01); *H01L 23/528* (2013.01); *H01L 23/5226* (2013.01); *H01L 27/092* (2013.01); *H01L 29/1079* (2013.01); *H01L 29/78* (2013.01)

(58) Field of Classification Search
CPC .............. H01L 27/0292; H01L 27/092; H01L 29/1079; H01L 23/528; H01L 23/5226; H01L 23/6226; H01L 29/78
See application file for complete search history.

(56) References Cited

U.S. PATENT DOCUMENTS

| | | | | |
|---|---|---|---|---|
| 5,371,653 | A * | 12/1994 | Kametani | H01L 23/467 174/252 |
| 5,768,109 | A * | 6/1998 | Gulick | H01L 23/13 174/255 |
| 2005/0218959 | A1* | 10/2005 | Yamawaki | H01L 23/5223 327/334 |
| 2009/0040671 | A1* | 2/2009 | Zhang | H02H 9/046 361/56 |
| 2013/0256801 | A1 | 10/2013 | Yen et al. | |
| 2016/0379958 | A1* | 12/2016 | Kuroda | H01L 21/76898 257/531 |

* cited by examiner

*Primary Examiner* — Zeev V Kitov
(74) *Attorney, Agent, or Firm* — WPAT, P.C., Intellectual Property Attorneys; Anthony King

(57) ABSTRACT

An integrated circuit (IC) structure is provided. The IC structure comprises a deep n-well (DWN), a first circuit, a second circuit, a first power line and a second power line. The first circuit is in the DWN. The second circuit is outside the DWN and electrically connected with the first circuit. The first power line is configured to provide the first circuit with power. The second power line is configured to provide the second circuit with power. The second power line is electrically connected with the first power line. The first power line and the second power line are in different conductive layers.

20 Claims, 3 Drawing Sheets

SEMICONDUCTOR DEVICE AND METHOD OF MANUFACTURING THE SAME

BACKGROUND

Integrated circuits (ICs) have become increasingly important and popular in applications such as cell phones, smart phones, tablets, laptops, notebook computers, PDAs, wireless email terminals, MP3 audio and video players, and portable wireless web browsers. Nowadays, more and more integrated circuits include powerful and efficient on-board data storage and logic circuitry for signal control and processing.

With the development of advanced semiconductor manufacturing technology, device features in an integrated circuit are downsized. However, an increasingly higher density of devices and a more sophisticated combination of various types of circuitry, such as logic and radio frequency processing circuits, are more liable to incur noise in an integrated circuit. Noise can be detrimental to an integrated circuit because signal integrity can be compromised, which can in turn cause data loss or errors in logic or signal processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

DETAILED DESCRIPTION

Figure 1:
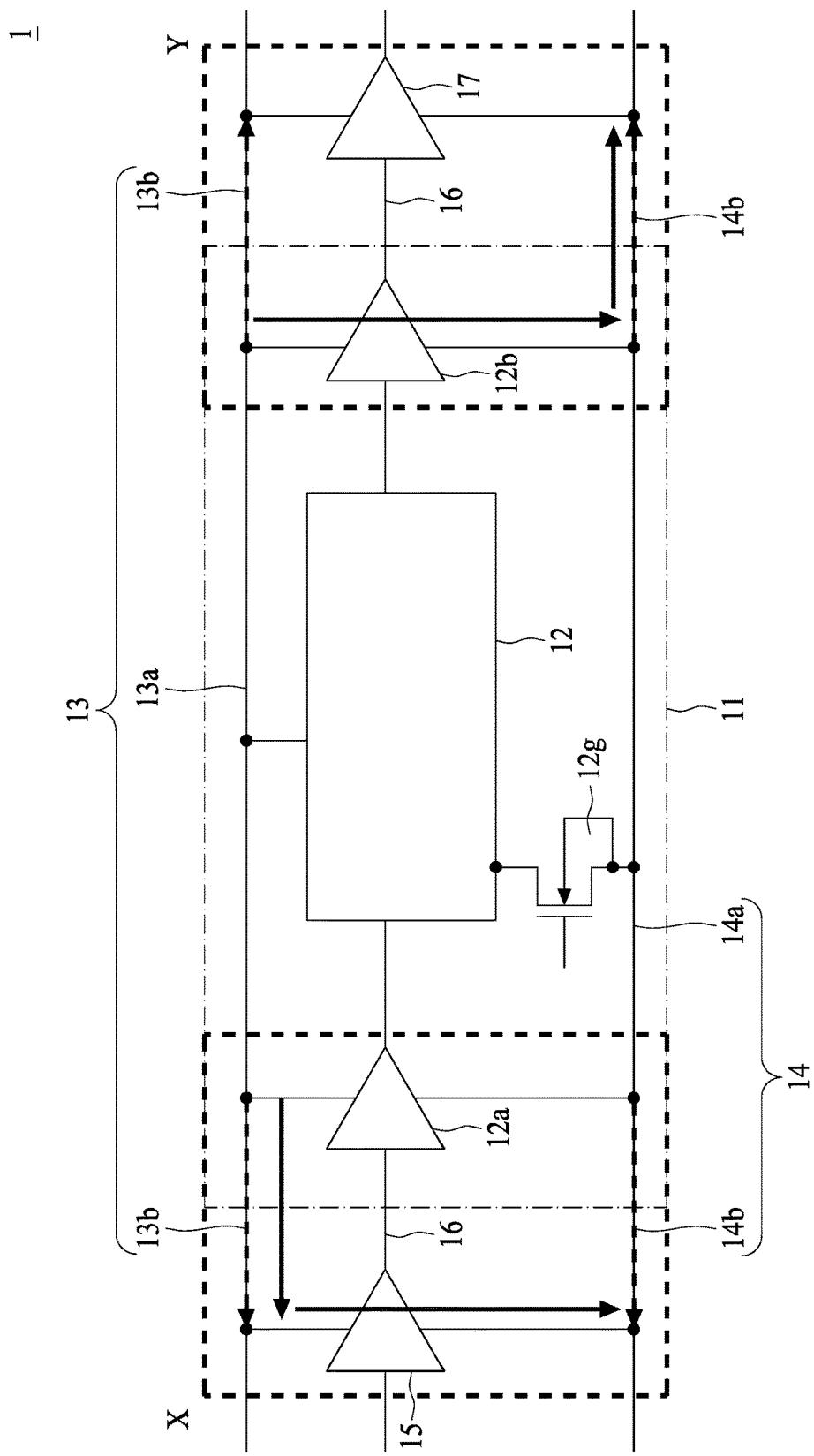
FIG. 1 is a circuit diagram of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a circuit diagram of an integrated circuit (IC) 1 in accordance with some embodiments of the present disclosure. The IC 1 comprises a first circuit 12, a second circuit 15 and a third circuit 17, which may be formed in a deep n-well (DNW) 11.

The DNW 11 is disposed in a semiconductor substrate (not shown). As mentioned above, noise can be detrimental to an integrated circuit because signal integrity can be compromised. Devices in an integrated circuit are formed in a deep doped well, such as the DNW 11, to isolate noise from a substrate. A deep doped well refers to one located deeper into a substrate than others. Moreover, a deep doped well may be used to block noise from transmission between the substrate and the deep doped well. In an embodiment, the DNW 11 is configured to provide noise isolation between a digital block and an analog block. In some embodiments, the DNW 11 is configured to provide a low resistance path for conducting noise to a ground node to prevent the noise from affecting devices in the DNW 11. These devices, which may be used for high speed applications, having mixed signals, or having radio frequency (RF) circuits, are susceptible to noise interference.

The first circuit 12 is formed within the DNW 11. In some embodiments, the first circuit 12 may comprise any kinds of logic circuits such as inverters, buffers, AND gates, OR gates, XOR gates, flip-flops or a combination thereof. In some embodiments, the first circuit 12 may comprise analog circuits or radio frequency (RF) circuits. The first circuit 12 is connected to a power line 13a to receive power. In some embodiments, power is applied to the first circuit 12 from a power supply external to the IC 1. Alternatively, power is applied to the first circuit 12 from a power supply in the IC 1. The first circuit 12 is connected to a ground line 14a that provides a grounding path. In some embodiments, the first circuit 12 is connected to the ground line 14a through at least one switch 12g, for example, an n-type metal-oxide-semiconductor (NMOS) transistor. The NMOS switch 12g, disposed between an internal ground node of the first circuit 12 and the ground line 14a, may raise a current leakage issue. The leakage issue is alleviated by placing the first circuit 12 in the DNW 11 since the DNW 11 can be used as a power gating to reduce leakage current. In some embodiments, the first circuit 12 is connected to the ground line 14a directly.

An input circuit 12a is coupled to an input of the first circuit 12. The input circuit 12a is configured to serve as an input stage for the first circuit 12. Examples of the input circuit 12a include an inverter or a buffer. Moreover, the input circuit 12a is located at a boundary within the DNW 11. In some embodiments, the first circuit 12 may comprise the input circuit 12a to receive an input signal.

Likewise, an output circuit 12b is coupled to an output of the first circuit 12a. The output circuit 12b is configured to serve as an output stage for the first circuit 12. Examples of the output circuit 12b include an inverter or a buffer. Moreover, the output circuit 12b is located at a boundary within the DNW 11. In some embodiments, the first circuit 12 may comprise the output circuit 12b to output a signal.

The second circuit 15 is located outside the DNW 11. In some embodiments, the second circuit 15 may comprise inverters or buffers. The second circuit 15 is connected to the input circuit 12a of the first circuit 12 through a signal line 16 to transmit signal or data. The second circuit 15 is connected to a power line 13b to receive power. In some embodiments, power is applied to the second circuit 15 from a power supply external to the IC 1. Alternatively, power is applied to the second circuit 15 from a power supply in the IC 1. The second circuit 15 is connected to a ground line 14b that provides a grounding path.

In the layout of the IC 1, the power line 13a connected to the first circuit 12 and the power line 13b connected to the second circuit 15 are formed by metal lines in different layers. In some embodiments, the metal line forming the power line 13a is in a higher layer than the metal line for forming the signal line 16, while the metal line forming the power line 13b is in the same layer as or in a lower layer than the metal line for forming the signal line 16. The power line 13a and the power line 13b are connected through vias or contacts.

The third circuit 17 is located outside the DNW 11. In some embodiments, the third circuit may comprise inverters or buffers. The third circuit 17 is connected to the output circuit 12b of the first circuit 12 through a signal line 16 to receive signal or data from the first circuit 12. The third circuit 17 is connected to the power line 13b to receive power. In some embodiments, power is applied to the third circuit 17 from a power supply external to the IC 1. Alternatively, power is applied to the third circuit 17 from a power supply in the IC 1. The third circuit 17 is connected to a ground line 14b that provides a grounding path.

In the layout of the IC 1, the power line 13a connected to the first circuit 12 and the power line 13b connected to the third circuit 17 are formed by metal lines in different layers. In some embodiments, the metal line for forming the power line 13a is in a higher layer than the metal line for forming the signal line 16, while the metal line for forming the power line 13b is in the same layer as or in a lower layer than the metal line for forming the signal line 16. In some embodiments, the power line 13a and the power line 13b are connected through vias or contacts, and the ground line 14a and the ground line 14b are connected through vias or contacts.

As illustrated in FIG. 1, since the region of the DNW 11 is relatively large, a significant amount of charges (positive plasma ions) may be accumulated in the DNW 11. The charges are accumulated in the DNW 1 during one or more plasma processing operations, such as etching, film deposition, and ion implant. According to the equation V=Q/C, where V represents the voltage across a capacitor, Q represents the magnitude of charge stored in the capacitor, and C represents the capacitance of the capacitor, the larger accumulated charge would result in a higher voltage built between the first circuit 12 within the DNW 11 and the second circuit 15 external to the DNW 11 or between the first circuit 12 within the DNW 11 and the third circuit 17 external to the DNW 11. Such a high voltage may cause damage to the first circuit 12, the second circuit 15 or the third circuit 17. In some existing approaches, to prevent an IC from the damage, an antenna rule is used to constrain a ratio of the area of a DWN to the area of an NMOS gate external to the DWN. For example, the ratio is approximately $5 \times 10^5$. However, such a large area DWN would increase the total area and the manufacturing cost of the IC. In still some approaches, large protection diodes are added between the power line 13b and the signal line 16 at an output of the first circuit 12, and between the ground line 14b and the signal line 16 at an input of the first circuit 12. However, the large protection diodes would increase the total area of the IC and cause the routing more complicated, and hence increase the manufacturing cost of the IC.

As illustrated in FIG. 1, by using a metal line in a separate layer lower than the signal line 16 to form the power line 13b of the second circuit 15 and the third circuit 17 external to the DNW 11, the accumulated charges are able to be discharged through the following paths: (i) the path formed by a parasitic diode between the input circuit 12a and the second circuit 15, as indicated by dashed arrows; and (ii) the path formed by the power line 13a, the power line 13b, the channel of the second circuit 15 and the ground line 14b, as indicated by solid arrows. In some embodiments, most accumulated charges are discharged through the path (ii) stated above. Similarly, by using a metal line in a separate layer lower than the signal line 16 to form the ground line 14b of the second circuit 15 and the third circuit 17, the accumulated charges are able to be discharged through the following paths: (i) the path formed by a parasitic diode between the output circuit 12b and the third circuit 17, as indicated by dashed arrows; and (ii) the path formed by the power line 13a, the channel of the output circuit 12b of the first circuit 12, the ground line 14a and the ground line 14b, as indicated by solid arrows. In some embodiments, most accumulated charges are discharged through the path (ii) stated above. Therefore, in accordance with the embodiments illustrates in FIG. 1, the charges accumulated in the DNW 11 are discharged without following the antenna rule or using any large protection diodes, which in turn reduces the total area and the manufacturing cost of the IC 1.

Figure 2:
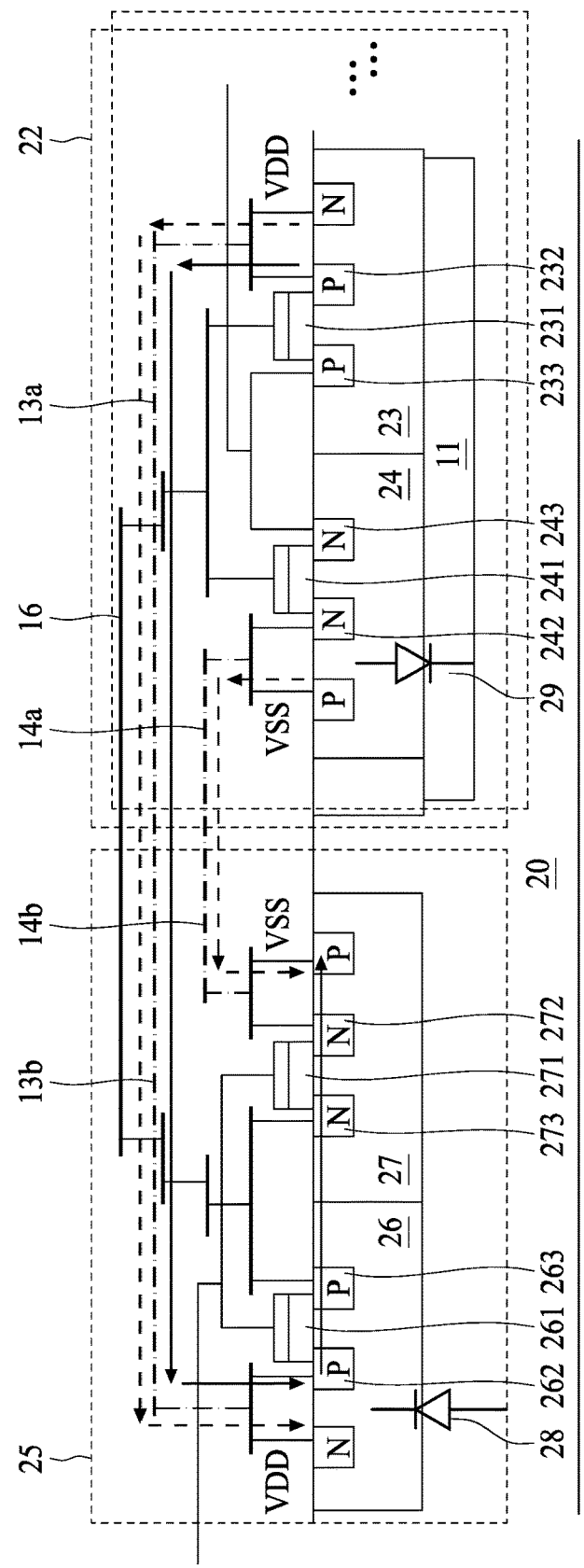
FIG. 2 is a cross-sectional view of a portion of the integrated circuit in FIG. 1, in accordance with some embodiments.

FIG. 2 is a cross-sectional view of a portion of the first circuit 12 and the second circuit 15 shown in FIG. 1 in a dotted rectangle X. In accordance with some embodiments, an inverter 22 that is a portion of the first circuit 12 is located in the DNW 11 and an inverter 25 that is a portion of the second circuit 15 is located outside the DNW 11.

The DNW 11 is formed in a substrate 20. The substrate 20 may be a p type doped substrate, or an n type doped substrate, which means that the substrate 20 may be doped with either n type or p type impurities. The substrate 20 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate.

It is known in the art that dopant impurities can be implanted into a semiconductor material to form a p type or an n type material. A p type material may be further classified as p++(very highly doped), p+(heavily doped), p (moderately doped), p− (lightly doped), p−− (very lightly doped), type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is also known in the art that implantation can be done through certain materials, such as thin oxide layers.

The DNW 11 extends continuously from a top surface of the substrate 20 into the substrate 20. The doping concentration accounts for the DNW 11 and the diffusion may vary as the process and design vary. In some embodiments, the DNW 11 has a dopant impurity concentration of, for example, about $10^{15}/cm^3$ to about $10^{16}/cm^3$. One skilled in the art will recognize, however, that these dopant impurity concentrations depend upon the specific device type, technology generation, minimum feature size, and the like. It is intended, therefore, that terms relating to dopant concentrations be interpreted in light of the technology being evaluated and not be limited to the described embodiments.

The inverter 22 formed in the DNW 11 comprises a PMOS transistor and an NMOS transistor. The PMOS transistor comprises an n-well region 23, a gate region 231, a drain region 233 and a source region 232. The n-well region 23 is formed in the DNW 11. The gate region 231 is disposed over the n-well region 23 and the gate dielectric layer (not shown in the drawing) is disposed between the gate region 231 and the n-well region 23. According to some embodiments of the present disclosure, the gate dielectric layer is silicon dioxide that is grown on the n-well region 23 by, for example, thermal oxidation, but not limited thereto. Other suitable gate dielectric materials may include, for example, oxide-nitride-oxide (ONO) or compound silicon oxide. The gate region 231 may comprise a doped polysilicon, but not limited thereto. Further, a silicide (not shown) may be formed on the gate region 231 in order to reduce contact resistance.

The drain region 233 and the source region 232 are of the same conductivity type and are within the n-well region 23. The drain region 233 may have a drain contact (not shown in the drawing). The source region 232 may have a source contact (not shown in the drawing). Both the drain region 233 and the source region 232 are formed by implanting ions of an impurity of the same conductivity type, such as a p type, into the n-well region 23. The drain region 233 and the source region 232 may be formed by implanting a p type dopant such as phosphorous at a concentration between about $1\times10^{19}/cm^3$ and about $2\times10^{21}/cm^3$, for example.

The NMOS transistor of the inverter 22 comprises a p-well region 24, a gate region 241, a drain region 243 and a source region 242. The p-well region 24 is formed in the DNW 11. The gate region 241 is disposed over the p-well region 24 and the gate dielectric layer (not shown in the drawing) is disposed between the gate region 241 and the p-well region 24. According to some embodiments of the present disclosure, the gate dielectric layer is silicon dioxide that is grown on the p-well region 24 by, for example, thermal oxidation, but not limited thereto. Other suitable gate dielectric materials may include, for example, oxide-nitride-oxide (ONO) or compound silicon oxide. The gate region 241 may comprise a doped polysilicon, but not limited thereto. Further, a silicide (not shown) may be formed on the gate region 241 in order to reduce contact resistance.

The drain region 243 and the source region 242 are of the same conductivity type and are within the p-well region 24. The drain region 243 may have a drain contact (not shown in the drawing). The source region 242 may have a source contact (not shown in the drawing). Both the drain region 243 and the source region 242 are formed by implanting ions of an impurity of the same conductivity type, such as an n type, into the p-well region 24. The drain region 243 and the source region 242 may be formed by implanting an n type dopant such as phosphorous at a concentration between about $1\times10^{19}/cm^3$ and about $2\times10^{21}/cm^3$, for example.

The inverter 25 formed external to the DNW 11 comprises a PMOS transistor and an NMOS transistor. The PMOS transistor comprises an n-well region 26, a gate region 261, a drain region 263 and a source region 262. The n-well region 26 is formed in substrate 20. The gate region 261 is disposed over the n-well region 26 and the gate dielectric layer (not shown in the drawing) is disposed between the gate region 261 and the n-well region 26. According to some embodiments of the present disclosure, the gate dielectric layer is silicon dioxide that is grown on the n-well region 26 by, for example, thermal oxidation, but not limited thereto. Other suitable gate dielectric materials may include, for example, oxide-nitride-oxide (ONO) or compound silicon oxide. The gate region 261 may comprise a doped polysilicon, but not limited thereto. Further, a silicide (not shown) may be formed on the gate region 261 in order to reduce contact resistance.

The drain region 263 and the source region 262 are of the same conductivity type and are within the n-well region 26. The drain region 263 may have a drain contact (not shown in the drawing). The source region 262 may have a source contact (not shown in the drawing). Both the drain region 263 and the source region 262 are formed by implanting ions of an impurity of the same conductivity type, such as a p type, into the n-well region 26. The drain region 263 and the source region 262 may be formed by implanting a p type dopant such as phosphorous at a concentration between about $1\times10^{19}/cm^3$ and about $2\times10^{21}/cm^3$, for example.

The NMOS transistor of the inverter 25 comprises a p-well region 27, a gate region 271, a drain region 273 and a source region 272. The p-well region 27 is formed in the substrate 20. The gate region 271 is disposed over the p-well region 27 and the gate dielectric layer (not shown in the drawing) is disposed between the gate region 271 and the p-well region 27. According to some embodiments of the present disclosure, the gate dielectric layer is silicon dioxide that is grown on the p-well region 27 by, for example, thermal oxidation, but not limited thereto. Other suitable gate dielectric materials may include, for example, oxide-nitride-oxide (ONO) or compound silicon oxide. The gate region 271 may comprise a doped polysilicon, but not limited thereto. Further, a silicide (not shown) may be formed on the gate region 271 in order to reduce contact resistance.

The drain region 273 and the source region 272 are of the same conductivity type and are within the p-well region 27. The drain region 273 may have a drain contact (not shown in the drawing). The source region 272 may have a source contact (not shown in the drawing). Both the drain region 273 and the source region 272 are formed by implanting ions of an impurity of the same conductivity type, such as an n type, into the p-well region 27. The drain region 273 and the source region 272 may be formed by implanting an n type dopant such as phosphorous at a concentration between about $1\times10^{19}/cm^3$ and about $2\times10^{21}/cm^3$, for example.

The source region 232 of the PMOS transistor of the inverter 22 is connected with the power line 13a. The source region 242 of the NMOS transistor of the inverter 22 is connected with the ground line 14a. The gate region 231 of the PMOS transistor and the gate region 241 of the NMOS transistor of the inverter 22 are connected to each other as an input of the inverter 22 to receive signal or data from the inverter 25 through the signal line 16. The drain region 233 of the PMOS transistor and the drain region 243 of the NMOS transistor of the inverter 22 are connected to each other as an output of the inverter 22 to transfer signal or data to the next stage.

The source region 262 of the PMOS transistor of the inverter 25 is connected with the power line 13b. The source region 272 of the NMOS transistor of the inverter 25 is connected with the ground line 14b. The gate region 261 of the PMOS transistor and the gate region 271 of the NMOS transistor of the inverter 25 are connected to each other as an input of the inverter 25 to receive signal or data. The drain region 263 of the PMOS transistor and the drain region 273 of the NMOS transistor of the inverter 25 are connected to each other as an output of the inverter 25 to transfer signal or data to the inverter 22.

The power line 13a connected to the inverter 22 and the power line 13b connected to the inverter 25 are formed by metal lines in different layers. In some embodiments, the metal line for forming the power line 13a is in a higher layer than the metal line for forming the signal line 16, while the metal line for forming the power line 13b is in the same layer as or in a lower layer than the metal line for forming the signal line 16. For example, the signal line 16 may be formed by a third metal layer (M3) above the substrate 20. The power line 13a and the ground line 14a connected to the inverter 22 in the DNW 11 may be formed by a sixth metal layer (M6) above the third metal layer while the power line 13b and the ground line 14b connected to the inverter 25 exterior to the DNW 11 may be formed by a second metal layer (M2) between the substrate 20 and the third metal layer. In some embodiments, the power line 13a and the power line 13b are connected through vias or contacts, and the ground line 14a and the ground line 14b are connected through vias or contacts.

As mentioned above, many manufacturing processes involve plasma. If substrate 20 is not grounded properly, ions in the plasma could accumulate in various layers in and/or on substrate 20. For example, during reactive ion etch (RIE), the substrate 20 is biased to attract positive etching ions to increase ion energy and etch rate. Improper substrate grounding accumulates positive ions in or on substrate 20, such as positive ions in the DNW 11. DNW 11 is a relatively large region in comparison to the n-well 23 or the p-well 24. As a result, a significant amount of charges may be accumulated in DNW 11. The charges accumulated in DNW 11 can be a result of one or more plasma processing operations, such as etching, film deposition, and ion implant.

When the signal line 16 (an interconnect) between the gate regions 231, 241 of the PMOS and NMOS transistors of the inverter 22 and the drain regions 263, 273 of the PMOS and NMOS transistors of the inverter 25 is formed, the positive ions could flow from drain regions 263, 273 to the gate regions 231, 241 due to a voltage drop and could damage gate dielectric layers in the gate regions 231, 241. Damaged gate dielectric layers would cause the performance of the inverter 22 inconsistent and uncontrollable. Therefore, the charges in the DNW 11 would degrade the yield of the inverter 22.

As illustrated in FIG. 2, the accumulated charges could be discharged through the following paths: (i) the path formed by a parasitic diode between the inverter 22 and the inverter 25, as indicated by dashed arrows; and (ii) the path formed by the power line 13a, the power line 13b, the channel of the inverter 25 and the ground line 14b, as indicated by solid arrows. In some embodiments, most accumulated charges are discharged through the path (ii) stated above. Therefore, in accordance with the embodiments illustrates in FIG. 2, the charges accumulated in the DNW 11 can be discharged without following the antenna rule or using any large protection diodes, which would in turn reduce the total area and the manufacturing cost of the IC 1.

Figure 3:
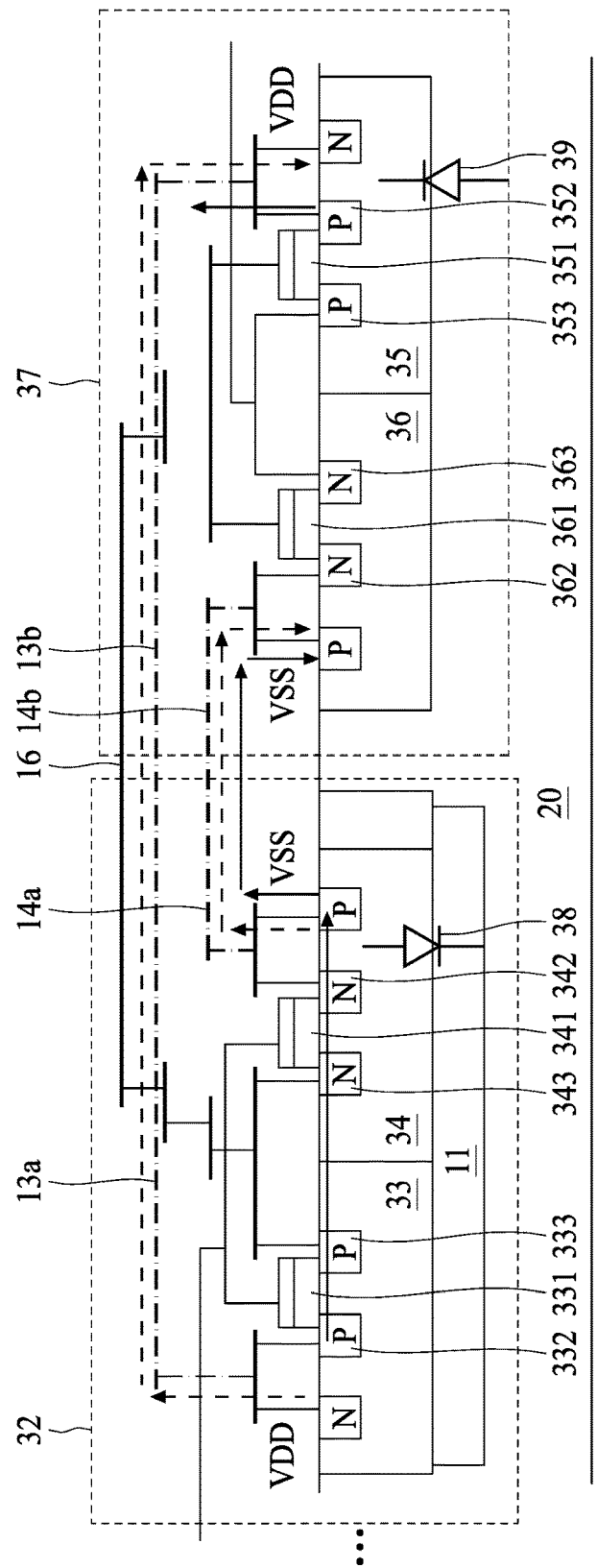
FIG. 3 is a cross-sectional view of a portion of the integrated circuit in FIG. 1, in accordance with some embodiments.

FIG. 3 is a cross-sectional view of a portion of the first circuit 12 and the third circuit 17 shown in FIG. 1 in a dotted rectangle Y. In accordance with some embodiments, an inverter 32 that is a portion of the first circuit 12 is located in the DNW 11 and an inverter 37 that is a portion of the third circuit 17 is located outside the DNW 11.

The inverter 32 formed in the DNW 11 comprises a PMOS transistor and an NMOS transistor. The PMOS transistor comprises an n-well region 33, a gate region 331, a drain region 333 and a source region 332. The n-well region 33 is formed in the DNW 11. The gate region 331 is disposed over the n-well region 33 and the gate dielectric layer (not shown in the drawing) is disposed between the gate region 331 and the n-well region 33. The drain region 333 and the source region 332 are of the same conductivity type and are within the n-well region 33. Both the drain region 333 and the source region 332 are formed by implanting ions of an impurity of the same conductivity type, such as a p type, into the n-well region 33.

The NMOS transistor of the inverter 32 comprises a p-well region 34, a gate region 341, a drain region 343 and a source region 342. The p-well region 34 is formed in the DNW 11. The gate region 341 is disposed over the p-well region 34 and the gate dielectric layer (not shown in the drawing) is disposed between the gate region 341 and the p-well region 34. The drain region 343 and the source region 342 are of the same conductivity type and are within the p-well region 34. Both the drain region 343 and the source region 342 are formed by implanting ions of an impurity of the same conductivity type, such as an n type, into the p-well region 34.

The inverter 37 formed external to the DNW 11 comprises a PMOS transistor and an NMOS transistor. The PMOS transistor comprises an n-well region 35, a gate region 351, a drain region 353 and a source region 352. The n-well region 35 is formed in substrate 20. The gate region 351 is disposed over the n-well region 35 and the gate dielectric layer (not shown in the drawing) is disposed between the gate region 351 and the n-well region 35. The drain region 353 and the source region 352 are of the same conductivity type and are within the n-well region 35. Both the drain region 353 and the source region 352 are formed by implanting ions of an impurity of the same conductivity type, such as a p type, into the n-well region 35.

The NMOS transistor of the inverter 36 comprises a p-well region 36, a gate region 361, a drain region 363 and a source region 362. The p-well region 36 is formed in the substrate 20. The gate region 361 is disposed over the p-well region 36 and the gate dielectric layer (not shown in the drawing) is disposed between the gate region 361 and the p-well region 36. The drain region 363 and the source region 362 are of the same conductivity type and are within the p-well region 36. Both the drain region 363 and the source region 362 are formed by implanting ions of an impurity of the same conductivity type, such as an n type, into the p-well region 36.

The source region 332 of the PMOS transistor of the inverter 32 is connected with the power line 13a. The source region 342 of the NMOS of the inverter 32 is connected with the ground line 14a. The gate region 331 of the PMOS transistor and the gate region 341 of the NMOS transistor of the inverter 32 are connected to each other as an input of the inverter 32 to receive signal or data. The drain region 333 of the PMOS transistor and the drain region 343 of the NMOS transistor of the inverter 32 are connected to each other as an output of the inverter 32 to transfer signal or data to the inverter 37.

The source region 352 of the PMOS transistor of the inverter 37 is connected with the power line 13b. The source region 362 of the NMOS transistor of the inverter 37 is connected with the ground line 14b. The gate region 351 of the PMOS transistor and the gate region 361 of the NMOS transistor of the inverter 37 are connected to each other as an input of the inverter 37 to receive signal or data from the inverter 32. The drain region 353 of the PMOS transistor and the drain region 363 of the NMOS transistor of the inverter 37 are connected to each other as an output of the inverter 37.

The power line 13a connected to the inverter 32 and the power line 13b connected to the inverter 37 are formed by metal lines in different layers. In some embodiments, the metal line for forming the power line 13a is in a higher layer than the metal line for forming the signal line 16, while the metal line for forming the power line 13b is in the same layer as or in a lower layer than the metal line for forming the signal line 16. For example, the signal line 16 may be formed by a third metal layer (M3) above the substrate 20. The power line 13a and the ground line 14a connected to the inverter 32 in the DNW 11 may be formed by a sixth metal layer (M6) above the third metal layer while the power line 13b and the ground line 14b connected to the inverter 37 exterior to the DNW 11 may be formed by a second metal layer (M2) between the substrate 20 and the third metal layer. In some embodiments, the power line 13a and the power line 13b are connected through vias or contacts, and the ground line 14a and the ground line 14b are connected through vias or contacts.

As shown in FIG. 3, the accumulated charges could be discharged through the following paths: (i) the path formed by a parasitic diode between the inverter 32 and the inverter 37, as indicated by dashed arrows; and (ii) the path formed by the power line 13b, the channel of the inverter 32, the ground line 14a and the ground line 14b, as indicated by solid arrows. In some embodiments, most accumulated charges are discharged through the path (ii) stated above. Therefore, in accordance with the embodiments illustrates in FIG. 3, the charges accumulated in the DNW 11 can be discharged without following the antenna rule or using any large protection diodes, which would in turn reduce the total area and the manufacturing cost of the IC 1.

In view of the above, the present disclosure provides an integrated circuit to overcome the problems in some existing integrated circuits. The integrated circuit of the present disclosure can discharge accumulated charges in a deep n-well without increasing the area of the deep n-well or using large protection diodes. Therefore, the integrated circuit can have a relatively small area, thereby reducing the manufacturing cost and enhancing the chip density.

Embodiments of the present disclosure provide an integrated circuit (IC) structure. The IC structure comprises a deep n-well (DWN), a first circuit, a second circuit, a first power line and a second power line. The first circuit is in the DWN. The second circuit is outside the DWN and electrically connected with the first circuit. The first power line is configured to provide the first circuit with power. The second power line is configured to provide the second circuit with power. The second power line is electrically connected with the first power line. The first power line and the second power line are in different conductive layers.

Embodiments of the present disclosure provide a semiconductor structure device. The semiconductor structure device comprises a deep DNW, a first PMOS transistor, a second PMOS transistor, a first power line and a second power line. The DNW is in the substrate. The PMOS is in the DNW. The second PMOS transistor is outside the DNW. The first power line is connected to a source of the first PMOS transistor. The second power line is connected to a source the second PMOS transistor. The first power line and the second power line are in different conductive layers and are connected through at least one via.

Embodiments of the present disclosure provide a method for protecting a semiconductor device structure. The method comprises (i) connecting a power terminal of a first circuit in the DNW to a first power line; (ii) connecting a power terminal of a second circuit outside the DNW to a second power line; (iii) connecting the first power line and the second power line; and (iv) discharging the electronic charge accumulated in the DNW through a path formed by the first power line and the second power line. The first power line and the second power line are in different conductive layers.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. An integrated circuit (IC) structure, comprising:
   a deep n-well (DWN);
   a first circuit in the DWN;
   a second circuit outside the DWN and electrically connected with the first circuit;
   a first power line to provide the first circuit with power;
   a second power line to provide the second circuit with power, the second power line electrically connected with the first power line, wherein the first power line and the second power line are in different conductive layers; and
   a first signal line, for connecting an output of the second circuit to an input circuit of the first circuit, wherein the first signal line is in a same layer as or a higher layer than the second power line.

2. The IC structure of claim 1, wherein the first power line, the second power line and the second circuit are configured to provide a path to discharge electronic charge accumulated in the DWN.

3. The IC structure of claim 1, wherein the input circuit of the first circuit is located at a boundary within the DWN.

4. The IC structure of claim 1, further comprising:
   a third circuit outside the DWN; and
   a third power line to provide the third circuit with power;
   a second signal line connecting an output circuit of the first circuit to an input of the third circuit, wherein the output circuit of the first circuit is at a boundary within the DWN and the second signal line is in a same layer as or a higher layer than the third power line.

5. The IC structure of claim 1, further comprising:
   a first ground line to provide a grounding path for the first circuit; and
   a second ground line to provide a grounding path for the second circuit, the second ground line electrically connected to the first ground line, wherein the first ground line and the second ground line are in different conductive layers.

6. The IC structure of claim 5, wherein the first ground line and the second ground line are configured to provide a path to discharge electronic charge accumulated in the DWN.

7. The IC structure of claim 5, wherein the input circuit of the first circuit is located at a boundary within the DWN and the first signal line is in a same layer as or a higher layer than the second ground line.

8. The IC structure of claim 5, further comprising:
a third circuit outside the DWN; and
a third ground line to provide a grounding path for the third circuit;
a second signal line connecting an output circuit of the first circuit to an input of the third circuit, wherein the output circuit of the first circuit is located at a boundary within the DWN and the second signal line is in a same layer as or a higher layer than the third ground line.

9. A semiconductor structure device, comprising:
a deep n-well (DNW) in a substrate;
a first p-channel metal-oxide-semiconductor (PMOS) transistor in the DNW;
a second PMOS transistor outside the DNW;
a first power line connected to a source of the first PMOS transistor;
a second power line connected to a source the second PMOS transistor, wherein the first power line and the second power line are in different conductive layers and are connected through at least one via; and
a signal line connected to a gate of the first PMOS transistor and a drain of the second PMOS transistor, wherein the signal line extends in a conductive layer above the second power line.

10. The semiconductor structure device of claim 9, wherein the first power line and the second power line are configured to provide a path to discharge electronic charge accumulated in the DNW.

11. The semiconductor structure device of claim 9, wherein the first power line extends in a conductive layer above the second power line.

12. The semiconductor structure device of claim 9, further comprising:
a first n-channel metal-oxide semiconductor (NMOS) transistor in the DNW;
a second NMOS transistor outside the DNW;
a first ground line connected to a source of the first NMOS transistor; and
a second ground line connected to a source of the second NMOS transistor,
wherein the first ground line and the second ground line are in different conductive layers and are connected through at least one via.

13. The semiconductor structure device of claim 12, wherein the first power line, the ground power line, the second PMOS and the second NMOS are configured to provide a path to discharge electronic charge accumulated in the DNW.

14. The semiconductor structure device of claim 12, wherein the first ground line extends in a conductive layer above the second ground line.

15. The semiconductor structure device of claim 12, wherein the signal line is connected to, a gate of the first NMOS transistor and a drain of the second NMOS transistor.

16. The semiconductor structure device of claim 15, wherein the signal line extends in a conductive layer above the second ground line.

17. The semiconductor structure device of claim 9, wherein the signal line extends in a conductive layer above the first power line.

18. A method for protecting a semiconductor device structure, the method comprising:
connecting a power terminal of a first circuit in a DNW to a first power line;
connecting a power terminal of a second circuit outside the DNW to a second power line;
connecting the first power line and the second power line, the first power line and the second power line being in different conductive layers of the semiconductor device structure;
connecting an output of the second circuit to an input circuit of the first circuit by a signal line, wherein the signal line is formed by a conductive layer extending in a same layer as or a higher layer than a conductive layer forming the second power line; and
discharging electronic charge accumulated in the DNW through a path formed by the first power line, the second power line and the second circuit.

19. The method of claim 18, further comprising:
connecting a ground terminal of the first circuit to a first ground line;
connecting a ground terminal of the second circuit to a second ground line;
connecting the first ground line and the second ground line; and
discharging the electronic charge accumulated in the DNW through a path formed by the first ground line and the second ground line, wherein the first ground line and the second ground line are in different conductive layers.

20. The method of claim 19, wherein the conductive layer forming the signal line extends in a same layer as or a higher layer than a conductive layer forming the second ground line.

* * * * *